(12) United States Patent
Lee et al.

(10) Patent No.: US 8,223,087 B2
(45) Date of Patent: Jul. 17, 2012

(54) MULTI-DISPLAY APPARATUS AND METHOD OF MANUFACTURING THE SAME

(75) Inventors: Young-gu Lee, Yongin-si (KR); In-seo Kee, Yongin-si (KR); Hong-shik Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 999 days.

(21) Appl. No.: 11/843,071

(22) Filed: Aug. 22, 2007

(65) Prior Publication Data

US 2008/0074345 A1 Mar. 27, 2008

Related U.S. Application Data

(63) Continuation-in-part of application No. 11/739,439, filed on Apr. 24, 2007, now Pat. No. 8,080,926.

(30) Foreign Application Priority Data

Sep. 25, 2006 (KR) .................. 10-2006-0092923
Jun. 5, 2007 (KR) .................. 10-2007-0055251

(51) Int. Cl.
*H01J 61/92* (2006.01)

(52) U.S. Cl. .............. 345/1.3; 345/1.1; 313/1; 362/367

(58) Field of Classification Search ............. 345/1.3, 345/1.1; 313/1; 362/367
See application file for complete search history.

(56) References Cited

U.S. PATENT DOCUMENTS

| 4,408,836 | A | | 10/1983 | Kikuno |
| 5,128,662 | A | * | 7/1992 | Failla ............... 345/1.3 |
| 5,164,853 | A | * | 11/1992 | Shimazaki ............ 349/73 |
| 5,796,452 | A | * | 8/1998 | Pierson ............ 349/73 |
| 5,801,797 | A | | 9/1998 | Iida et al. |
| 5,903,328 | A | | 5/1999 | Greene et al. |
| 6,803,978 | B2 | * | 10/2004 | Bayrle et al. ............ 349/73 |
| 7,489,286 | B2 | * | 2/2009 | Kawase et al. ............ 345/1.1 |
| 8,080,926 | B2 | * | 12/2011 | Lee et al. ............ 313/1 |
| 2002/0104769 | A1 | * | 8/2002 | Kim et al. ............ 206/320 |
| 2004/0014252 | A1 | | 1/2004 | Shimoda et al. |
| 2004/0256977 | A1 | | 12/2004 | Aston |
| 2005/0285811 | A1 | * | 12/2005 | Kawase et al. ............ 345/1.1 |

FOREIGN PATENT DOCUMENTS

JP 04116619 A * 4/1992

OTHER PUBLICATIONS

European Patent Office Office Action; Jan. 2, 2008; 07117199.5-1228.

* cited by examiner

*Primary Examiner* — Nimeshkumar Patel
*Assistant Examiner* — Christopher Raabe
(74) *Attorney, Agent, or Firm* — Cantor Colburn LLP

(57) ABSTRACT

Provided is a multi-display apparatus and a method of manufacturing the multi-display apparatus. The multi-display apparatus includes a plurality of display panels displaying images and a stepped portion formed in at least one of a pair of adjacent display panels so as to be indented in a thickness direction of the one of a pair of adjacent display panels. The pair of adjacent display panels is engaged with each other in the stepped portion.

22 Claims, 19 Drawing Sheets

MULTI-DISPLAY APPARATUS AND METHOD OF MANUFACTURING THE SAME

This application claims priority to Korean Patent Application No. 10-2006-0092923, filed on Sep. 25, 2006, and Korean Patent Application No. 10-2007-0055251, filed on Jun. 05, 2007, and all the benefits accruing therefrom under 35 U.S.C. §119, the contents of which are herein incorporated by reference in their entireties. This application is a Continuation-in-Part of U.S. patent application Ser. No. 11/739,439, filed on Apr. 24, 2007, in the U.S. Patent and Trademark Office, the contents of which are herein incorporated by reference in its entirety.

BACKGROUND OF THE INVENTION

1. Field of the Invention

The present invention relates to a multi-display apparatus and a method of manufacturing the same. More particularly, the present invention relates to a multi-display apparatus that minimizes image disconnection at seams of display panels incorporated therein, and a method of manufacturing the multi-display apparatus.

2. Description of the Related Art

Generally, large-screen multi-display apparatuses are implemented by connecting a plurality of display panels. In the past, large screens, such as large televisions for exhibition, were realized by connecting a plurality of Braun® tubes to one another. However, recently, due to the increasing demand for large screens in small mobile apparatuses, such as mobile phones or personal digital assistants ("PDAs"), large screens are being produced by connecting flat panel displays such as liquid crystal displays ("LCDs"), field emission displays ("FEDs"), plasma display panels ("PDPs"), and organic light-emitting diodes ("OLEDs").

Conventionally, multi-display apparatuses are manufactured by connecting display panels in parallel. That is, a multi-screen is realized by connecting a plurality of the display panels in parallel. However, an image at a seam between a pair of display panels is not smoothly formed when the pair of display panels is connected in parallel but may be severely disconnected at the seam between the pair of display panels.

One attempt to overcome this problem involves a structure in which first and second display panels are disposed one on top of the other, and pixel boundaries between the pair of first and second display panels are vertically aligned so that an image looks continuous to the eyes of a user.

However, while the vertical alignment of the two display panels provides some measure of image connection, the step difference between the two display panels results in a greater thickness of the overall structure. Considering that the recent trend is to pursue lightweight and slim display products, the increased product thickness of the multi-display apparatus may have a negative impact on competition of multi-display products in the market.

Accordingly, to ensure product competitiveness, there is a need for a multi-display apparatus that can mitigate the image disconnection at a seam between panels of the multi-display apparatus without increasing the thickness of the panels of the multi-display apparatus.

SUMMARY OF THE INVENTION

The present invention provides a multi-display apparatus with improved image connection at a seam of panels without increasing the thickness of the multi-display apparatus, and a method of manufacturing the multi-display apparatus.

According to an aspect of the present invention, there is provided a multi-display apparatus including a plurality of display panels displaying images and a stepped portion formed in at least one of a pair of adjacent display panels of the plurality of display panels so as to be indented in a thickness direction of the at least one display panel. The pair of adjacent display panels is engaged with each other in the stepped portion.

According to another aspect of the present invention, there is provided a method of manufacturing a multi-display apparatus. The method includes preparing a pair of display panels respectively including display devices and forming a stepped portion in at least one of the pair of display panels. The stepped portion is indented in a thickness direction of the pair of display panels. The method also includes engaging the display panels with each other in the stepped portion so as to form a screen.

BRIEF DESCRIPTION OF THE DRAWINGS

The above and other aspects, features, and advantages of the present invention will become more apparent by describing in detail exemplary embodiments thereof with reference to the attached drawings in which.

DETAILED DESCRIPTION OF THE INVENTION

Figure 1:
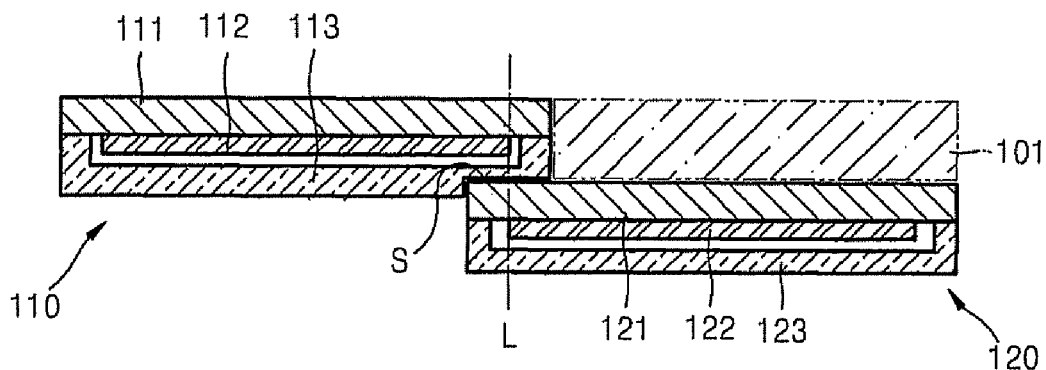
FIG. 1 illustrates a multi-display apparatus having a panel connection structure according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully with reference to the accompanying drawings in which exemplary embodiments of the invention are shown.

FIG. 1 illustrates a multi-display apparatus according to an embodiment of the present invention. Although the multi-display apparatus can be made by connecting a plurality of panels, which collectively represent an image, in various ways, in the present embodiment, connection of two display panels 110 and 120 will be described for convenience of description.

As depicted in FIG. 1, each of the display panels 110 and 120 has a structure in which display devices 112 and 122 that display images are respectively stacked on substrates 111 and 121, and covers 113 and 123 that surround the display devices 112 and 122 are attached to the respective substrates 111 and 121. If the display panels 110 and 120 are a top emission type, images formed by the display devices 112 and 122 are displayed through the covers 113 and 123, and if the display panels 110 and 120 are a bottom emission type, the images are displayed through the substrates 111 and 121. In the present embodiment, a bottom emission type is described for purposes of illustration.

In the present embodiment, the display panels 110 and 120 are arranged one on top of the other so that the display devices 112 and 122 are connected to, or otherwise engaged with, each other and that the display panels 110 and 120 partially overlap in a thickness direction of the display panels 110 and 120. That is, in the prior art, since only a pair of panels 110 and 120 are disposed with a step difference, the thickness of a conventional multi-display apparatus increases to more than double (i.e., in accordance with the thickness of each display panel) as compared to when panels are disposed in parallel side by side. However, in the present embodiment, the main bodies of the display panels 110 and 120 partially overlap in the thickness direction, thereby reducing the overall thickness of the product. In order to form the structure of the multi-display apparatus according to the present embodiment, the rear surface (that is, an edge of the cover 113) of the panel 110, which is located on a front side of the multi-display apparatus, is etched in the thickness direction of the panel 110 so as to form a stepped portion S, and a front edge of the panel 120, which is located on a rear side of the multi-display apparatus, is disposed in the stepped portion S of the panel 110, such that the two panels 110 and 120 are incorporated into a screen. By doing so, the two panels 110 and 120 are overlapped by a thickness of the stepped portion S of the panel 110, and thus the thickness of the overall product is reduced. As described herein, the front side of the multi-display apparatus denotes a side of the multi-display apparatus that is closer to the eyes of a viewer, and the rear side of the multi-display apparatus denotes a side of the multi-display apparatus that is farther from the eyes of the viewer.

A method of manufacturing the multi-display apparatus having the above structure depicted in FIG. 1 will now be described with reference to FIGS. 2A through 2D.

Figure 2A:
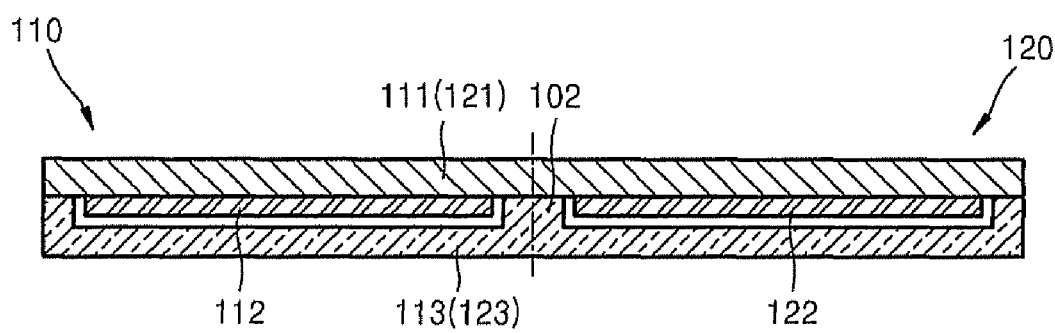
FIGS. 2A through 2D are cross-sectional views illustrating a method of manufacturing a panel connection structure of the multi-display apparatus of FIG. 1, according to an exemplary embodiment of the present invention.
Figure 2B:
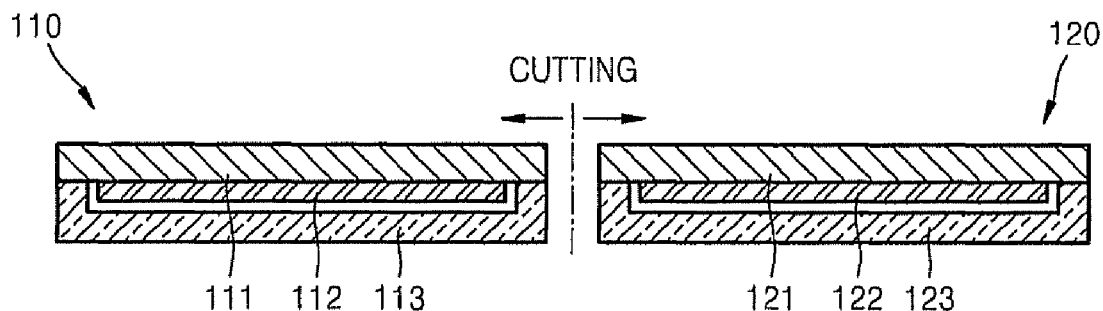
Figure 2C:
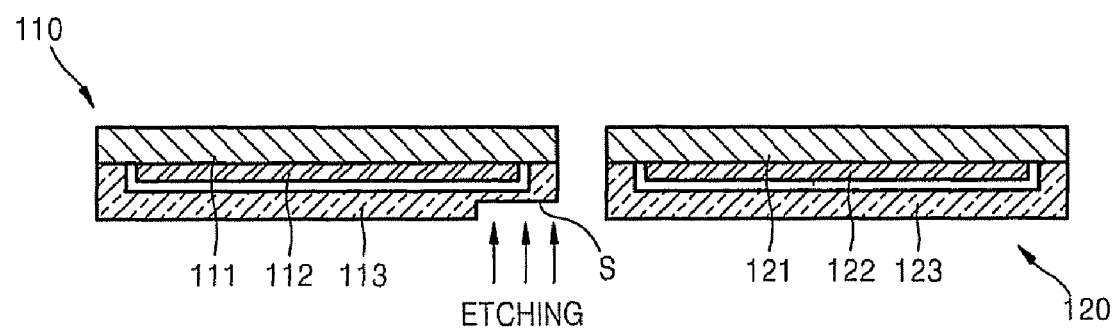
Figure 2D:
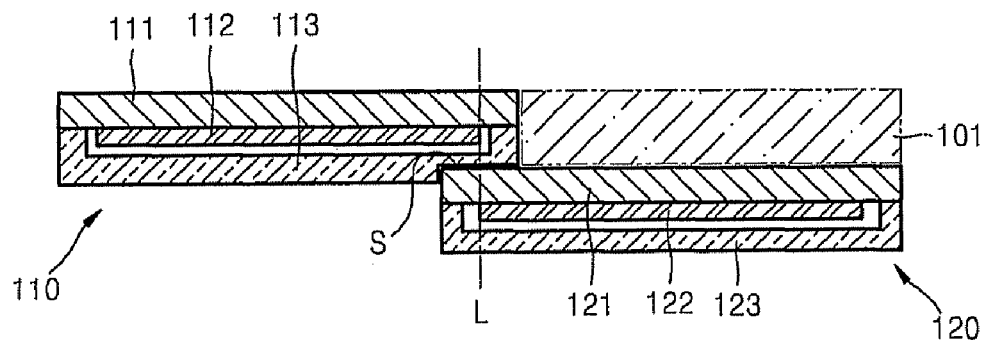

Referring to FIG. 2A, first, the display panels 110 and 120, in which the two display devices 112 and 122 are disposed side by side on the substrates 111 and 121 and covered by the covers 113 and 123 having a separation wall 102 therebetween, are prepared. Referring to FIG. 2B, the two display panels 110 and 120 are separated by cutting the substrates 111 and 121 and the covers 113 and 123 along the center line of the separation wall 102. In this state, the stepped portion S is formed by etching the display panel 110, which is to be located on a front side of the multi-display apparatus, in a thickness direction of the display panel 110. That is, an edge of the cover 113 of the display panel 110 is etched out as depicted in FIG. 2C. Next, as depicted in FIG. 2D, the two display panels 110 and 120 are disposed so that a front edge of the display panel 120 is located in the stepped portion S of the display panel 110 and that boundaries of the display devices 112 and 122 of the display panels 110 and 120 are aligned on a single line L. As such, the two display panels 110 and 120 overlap in a thickness direction thereof, thereby reducing the thickness of the multi-display apparatus as compared to the prior art. If a folding type apparatus is produced, when the display panels 110 and 120 are unfolded, the display panels 110 and 120 can be coupled using a hinge to allow the display panels to be unfolded as depicted in FIG. 2D. Therefore, the image disconnection at a seam between the display panels 110 and 120 can be improved and the problem of increasing the thickness of the multi-display apparatus can also be solved. An optical film 101 is formed on the substrate 121 of the display panel 120 having a relatively lower surface level than the substrate 111 of the display panel 110 so that an upper surface of the display panel 120 is horizontally aligned with an upper surface of the display panel 110.

Figure 3A:
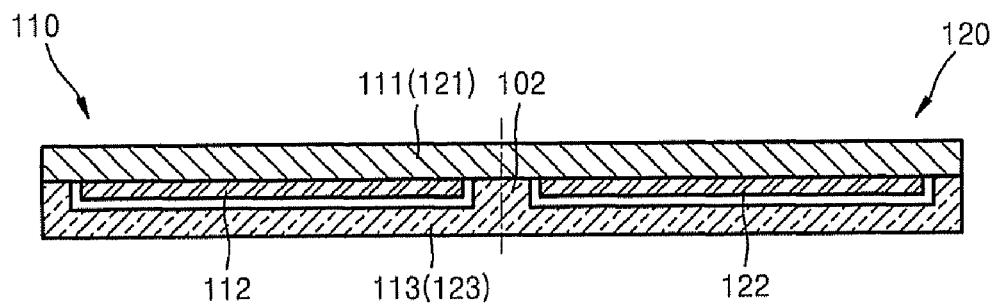
FIGS. 3A through 3D are cross-sectional views illustrating a method of manufacturing a panel connection structure of the multi-display apparatus of FIG. 1, according to another exemplary embodiment of the present invention.
Figure 3B:
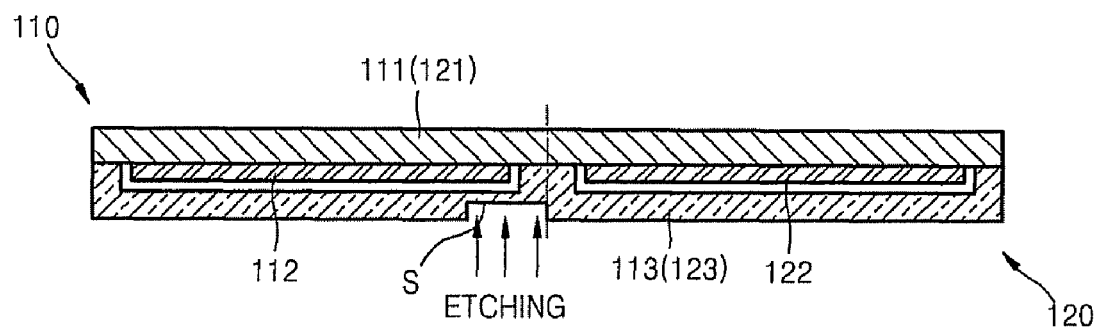
Figure 3C:
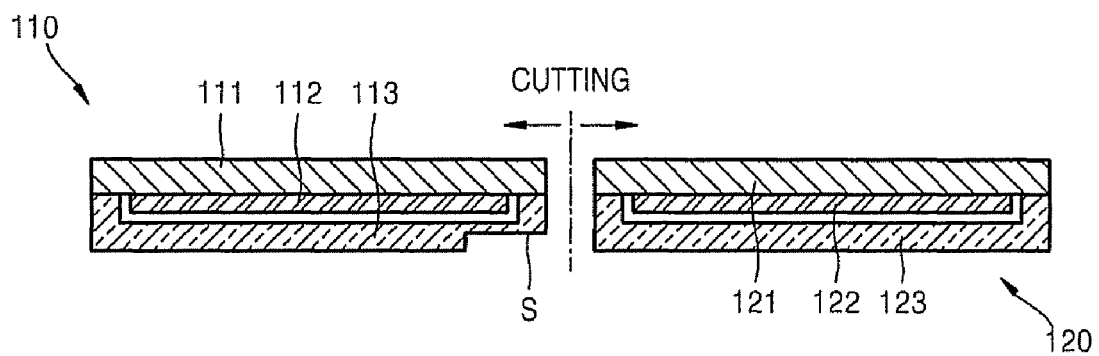
Figure 3D:
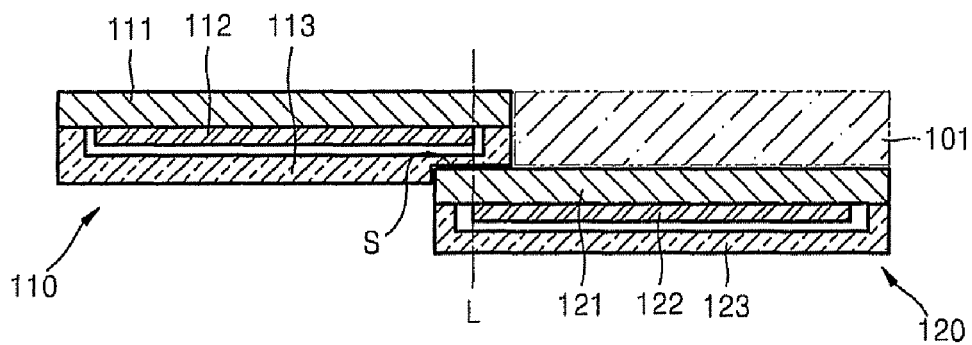

In the foregoing description, the etching is performed on the display panel 110 after obtaining the display panels 110 and 120 by cutting. However, the etching for forming the stepped portion S of the display panel 110 may be performed prior to separating the display panels 110 and 120. FIGS. 3A through 3D illustrate a method of manufacturing the multi-display apparatus of FIG. 1, according to another embodiment of the present invention, in which the etching is performed prior to separating the substrates. The preparation of the display panels 110 and 120 prior to separating as shown in FIG. 3A is the same as the foregoing description as illustrated in FIG. 2A. However, the two display panels 110 and 120 are not directly obtained by cutting at this point, but as depicted in FIG. 3B, a portion of the cover 113 of the display panel 110 is etched out to form a stepped portion S. Afterwards, as depicted in FIG. 3C, the display panels 110 and 120 are separated by cutting, and as depicted in FIG. 3D, the display panels 110 and 120 are connected through the stepped portion S, and the optical film 101 is formed on the substrate 121 of the display panel 120, thereby completing the manufacture of the multi-display apparatus as described above.

Figure 4:
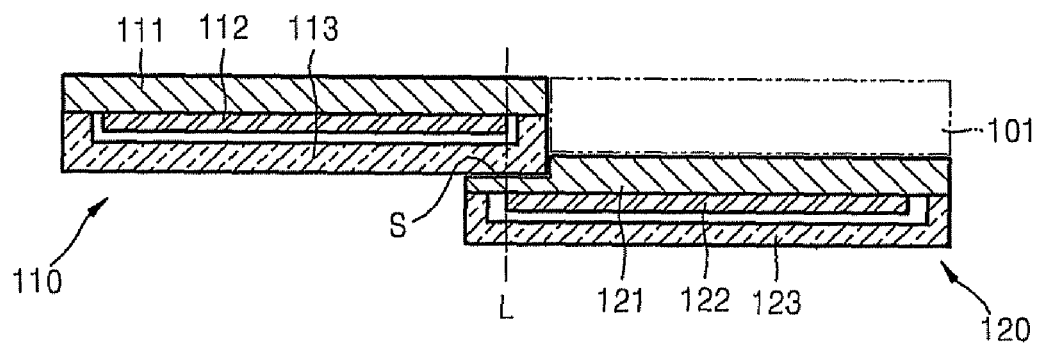
FIG. 4 illustrates a multi-display apparatus having a panel connection structure according to another exemplary embodiment of the present invention.

FIG. 4 illustrates a multi-display apparatus having a panel connection structure according to another embodiment of the present invention. In the present embodiment, a front surface (i.e., an edge of the substrate 121) of the display panel 120, which is located on a rear side of the multi-display apparatus in relation to the display panel 110, is etched to obtain the stepped portion S, and an edge of the rear surface of the display panel 110, which is located on a front side of the multi-display apparatus in relation to the display panel 120, is disposed in the stepped portion S, whereby the two display panels 110 and 120 are incorporated into a single screen. By doing this, the two display panels 110 and 120 overlap by a thickness of the stepped portion S.

The multi-display apparatus illustrated in FIG. 4 may be manufactured according to either a method of performing etching after cutting the two display panels 110 and 120 or a method of cutting the two display panels 110 and 120 after performing etching. The manufacture of the multi-display apparatus of FIG. 4 according to the method of performing etching after cutting the two display panels 110 and 120 will now be described with reference to FIGS. 5A through 5D.

Figure 5A:
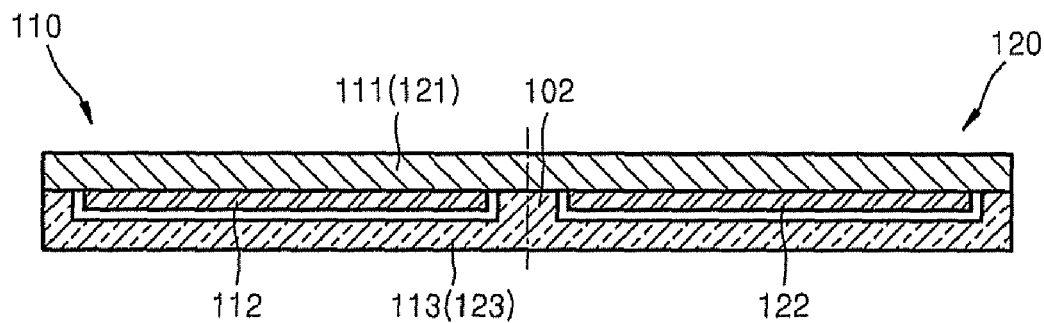
FIGS. 5A through 5D are cross-sectional views illustrating a method of manufacturing a panel connection structure of the multi-display apparatus of FIG. 4, according to an exemplary embodiment of the present invention.
Figure 5B:
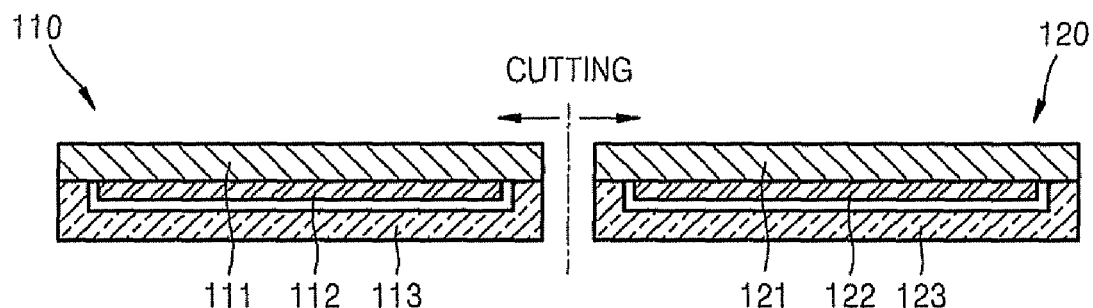
Figure 5C:
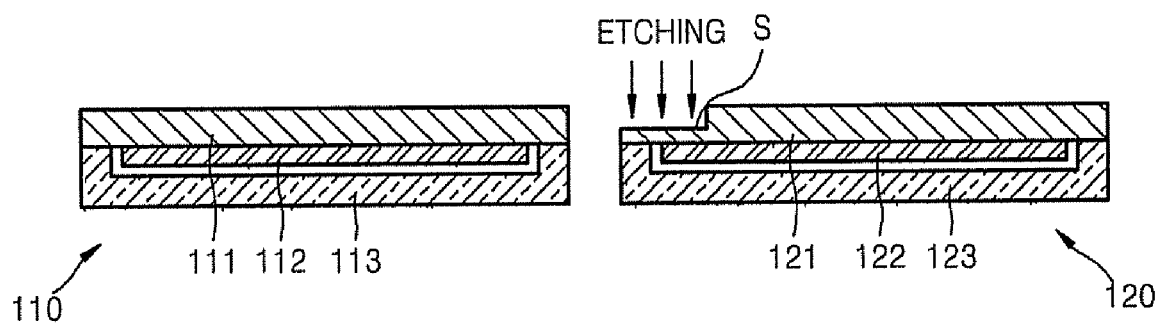
Figure 5D:
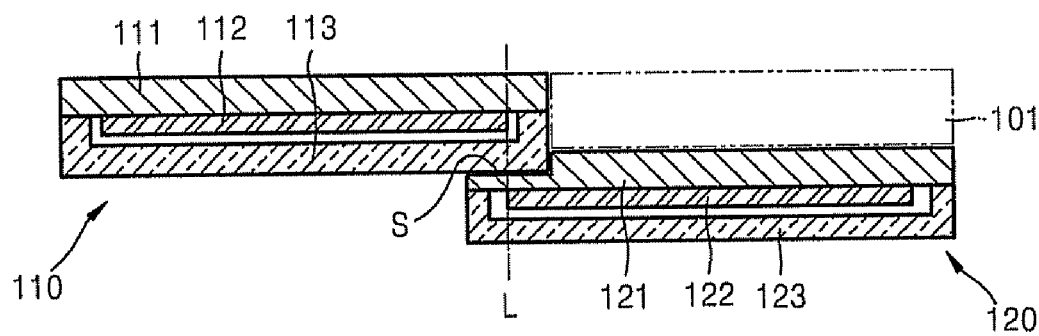

As depicted in FIG. 5A, first, the display panels 110 and 120, in which the two display devices 112 and 122 are disposed side by side on the substrates 111 and 121 and are respectively covered by the covers 113 and 123 having a separation wall 102 therebetween, are prepared. Referring to FIG. 5B, the two display panels 110 and 120 are separated by cutting the substrates 111 and 121 and the covers 113 and 123 along the center line of the separation wall 102. In this state, the stepped portion S is formed by etching the display panel 120, which is to be located on a rear side of the multi-display apparatus, in a thickness direction of the display panel 120. That is, an edge of the substrate 121 of the display panel 120 is etched out as depicted in FIG. 5C. Next, as depicted in FIG. 5D, the two display panels 110 and 120 are disposed so that a rear edge of the display panel 110 is located in the stepped portion S of the display panel 120 and that boundaries of the display devices 112 and 122 of the display panels 110 and 120 are aligned on a single line L. As such, the two display panels 110 and 120 overlap in a thickness direction thereof, thereby reducing the thickness of the multi-display apparatus as compared to the prior art. In addition, an optical film 101 is formed on the substrate 121 of the display panel 120 having a relatively lower surface level than the substrate 111 of the display panel 110 so that an upper surface of the display panel 120 is horizontally aligned with an upper surface of the display panel 110.

The manufacture of the multi-display apparatus illustrated in FIG. 4 according to the method of separating the two display panels 110 and 120 after performing etching will now be described with reference to FIGS. 6A through 6D.

Figure 6A:
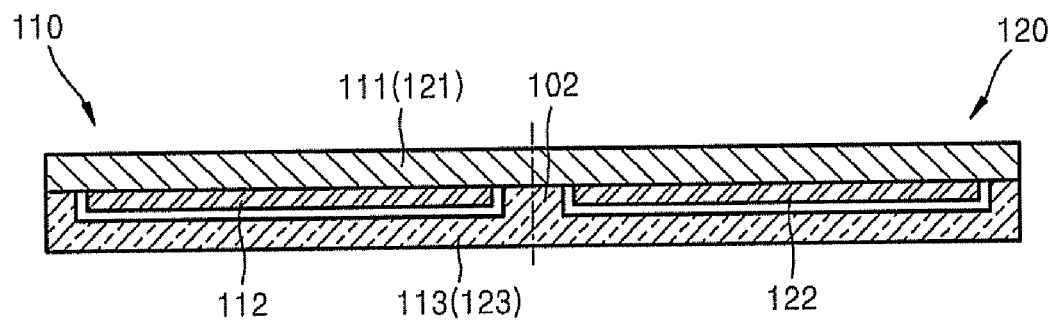
FIGS. 6A through 6D are cross-sectional views illustrating a method of manufacturing a panel connection structure of the multi-display apparatus of FIG. 4, according to another exemplary embodiment of the present invention.
Figure 6B:
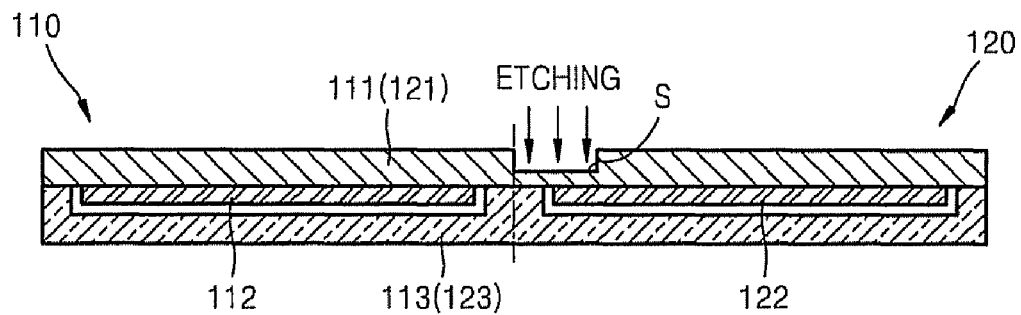
Figure 6C:
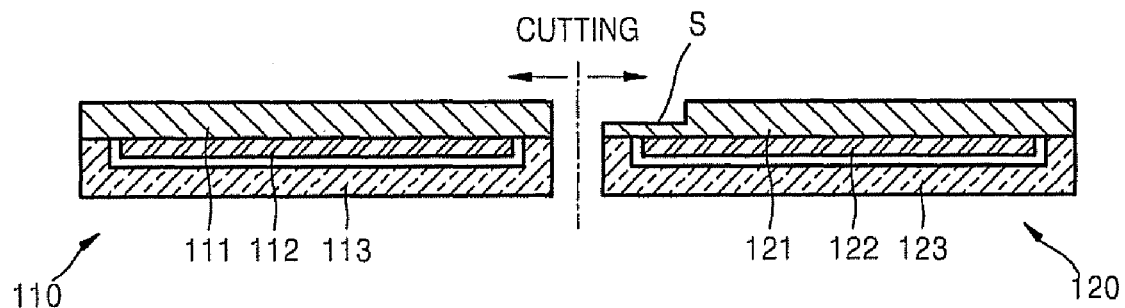
Figure 6D:
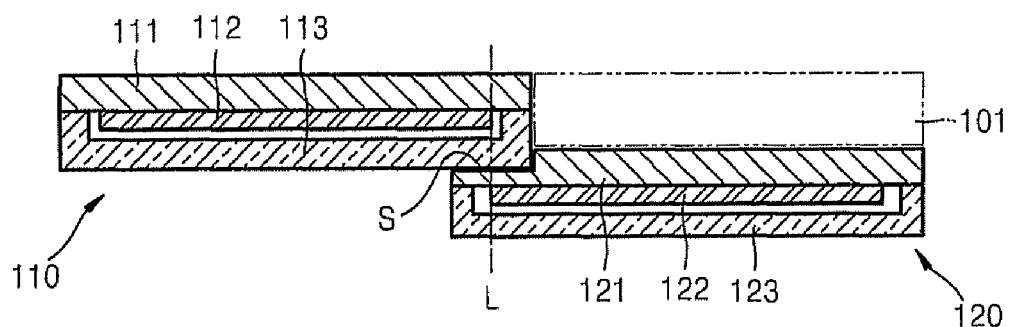

The preparation of the display panels 110 and 120 not yet separated as depicted in FIG. 6A is the same as that in the embodiment illustrated in FIG. 5A. Then, instead of separating the two display panels 110 and 120, etching is performed as depicted in FIG. 6B to thereby form a stepped portion S in the substrate 121 of the display panel 120. Afterwards, as depicted in FIG. 6C, the two display panels 110 and 120 are separated by cutting. Next, as depicted in FIG. 6D, the two display panels 110 and 120 are connected to each other through the stepped portion S, and the optical film 101 is installed, thereby completing the structure of the multi-display apparatus illustrated in FIG. 4.

Figure 7:
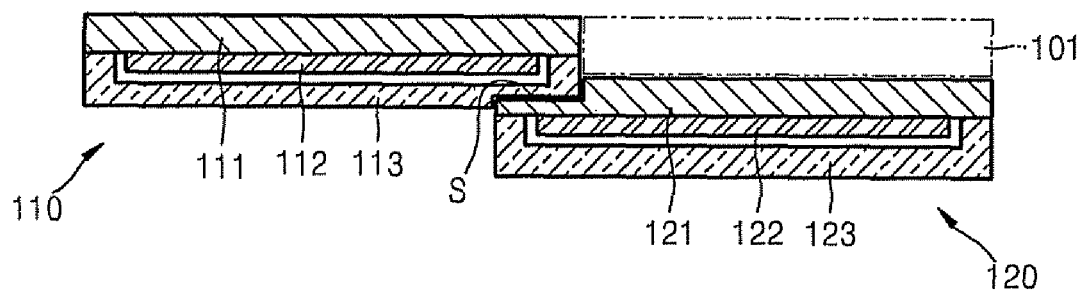
FIG. 7 illustrates a multi-display apparatus having a panel connection structure according to another exemplary embodiment of the present invention.

FIG. 7 illustrates a multi-display apparatus having a panel connection structure according to another embodiment of the present invention. In the present embodiment, edges of the display panels 110 and 120 are etched to obtain stepped portions S, and the display panels 110 and 120 are disposed so that the stepped portions S engage with each other, whereby the two display panels 110 and 120 are incorporated into a single screen. In other words, in the embodiments illustrated in FIGS. 1 and 4, one of the two display panels 110 and 120 has a stepped portion S, whereas in the present embodiment both the displays 110 and 120 have stepped portions S.

The multi-display apparatus illustrated in FIG. 7 may be manufactured according to either a method of performing etching after cutting the two display panels 110 and 120 or a method of cutting the two display panels 110 and 120 after performing etching. The manufacture of the multi-display apparatus of FIG. 7 according to the method of performing etching after cutting the two display panels 110 and 120 will now be described with reference to FIGS. 8A through 8D.

Figure 8A:
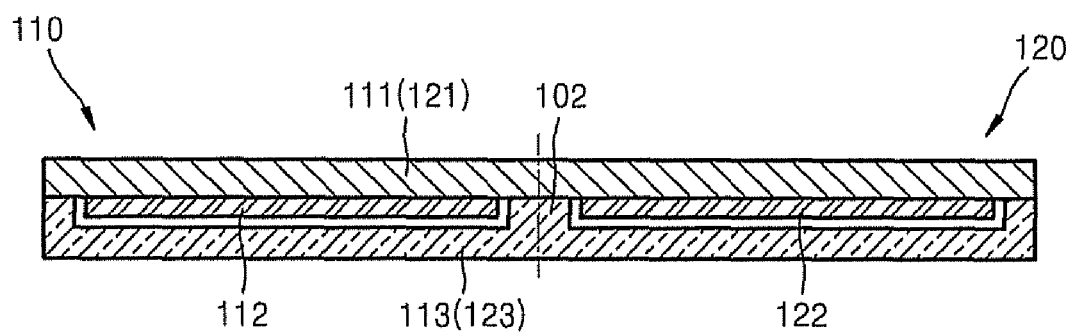
FIGS. 8A through 8D are cross-sectional views illustrating a method of manufacturing the multi-display apparatus of FIG. 7, according to an exemplary embodiment of the present invention.
Figure 8B:
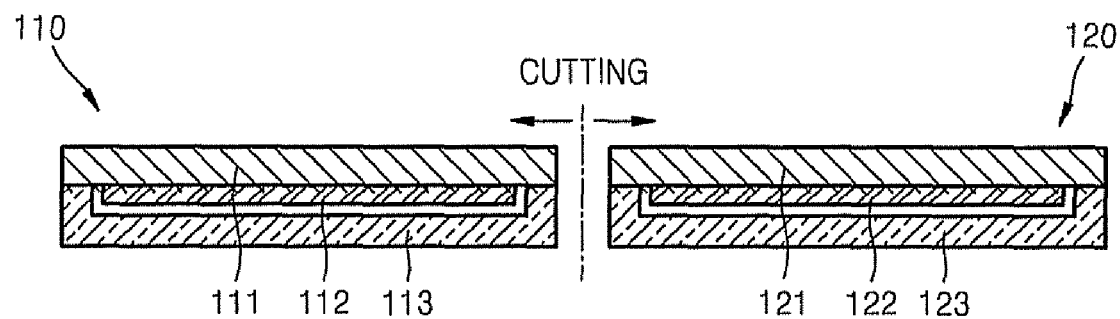
Figure 8C:
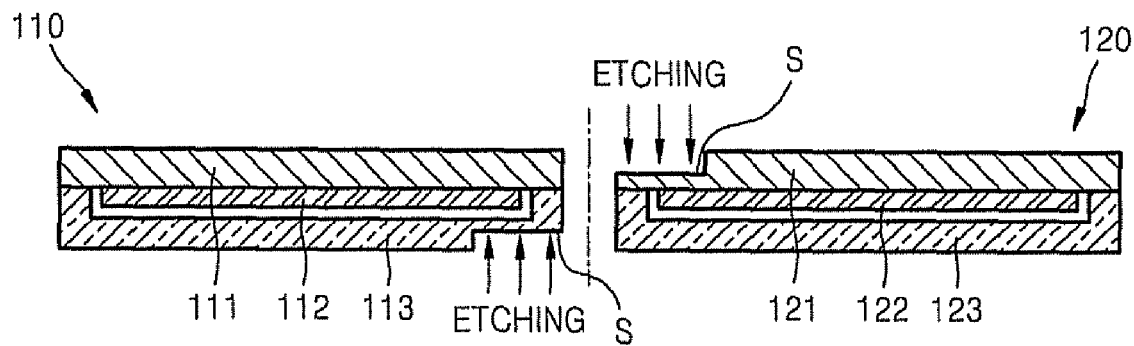
Figure 8D:
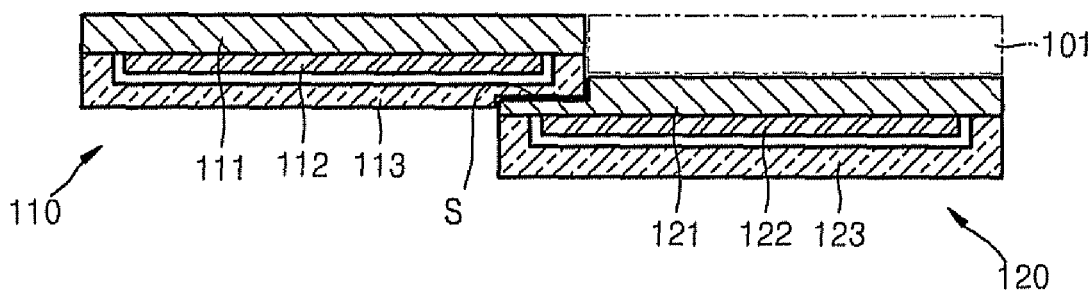

First, as depicted in FIG. 8A, the display panels 110 and 120 in which the two display devices 112 and 122 are disposed side by side on the substrates 111 and 121 and covered by the covers 113 and 123 having the separation wall 102 are prepared. Then, as depicted in FIG. 8B, the display panels 110 and 120 are separated by cutting along the center line of the separation wall 102. As depicted in FIG. 8C, an edge of the substrate 121 corresponding to the front surface of the panel 120, which is to be located at a rear side of the multi-display apparatus, is etched, and an edge of the cover 113 corresponding to the rear surface of the display panel 110, which is to be located at a front side of the multi-display apparatus, is also etched, whereby the stepped portions S are formed. Next, as depicted in FIG. 8D, the display panels 110 and 120 are connected to each other so that the stepped portions S engage with each other. Accordingly, the display devices 112 and 122 of the display panels 110 and 120 are connected together, and the overall thickness of the multi-display apparatus is reduced as compared to the prior art. In order to match the heights of the display panels 110 and 120, the optical film 101 is installed on the display panel 120.

The manufacture of the multi-display apparatus illustrated in FIG. 7 according to the method of performing etching prior to separating the display panels 110 and 120 will now be described with reference to FIGS. 9A through 9D.

Figure 9A:
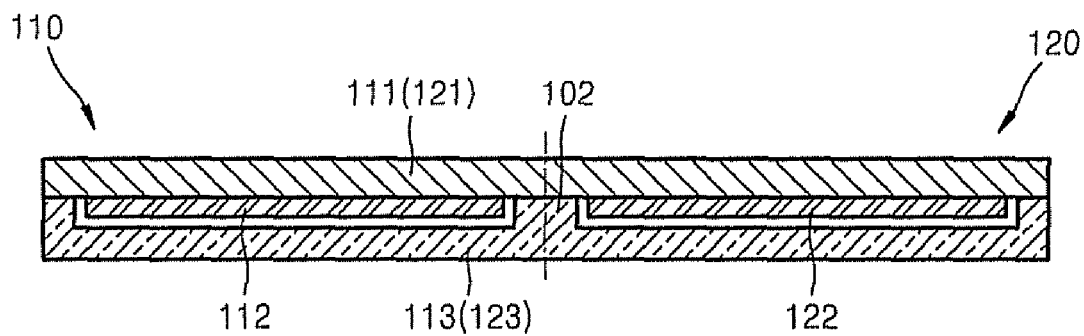
FIGS. 9A through 9D are cross-sectional views illustrating a method of manufacturing a panel connection structure of the multi-display apparatus of FIG. 7, according to another exemplary embodiment of the present invention.
Figure 9B:
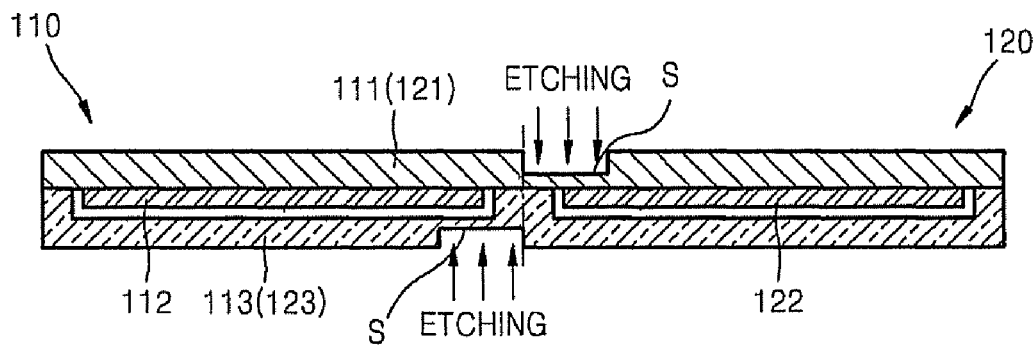
Figure 9C:
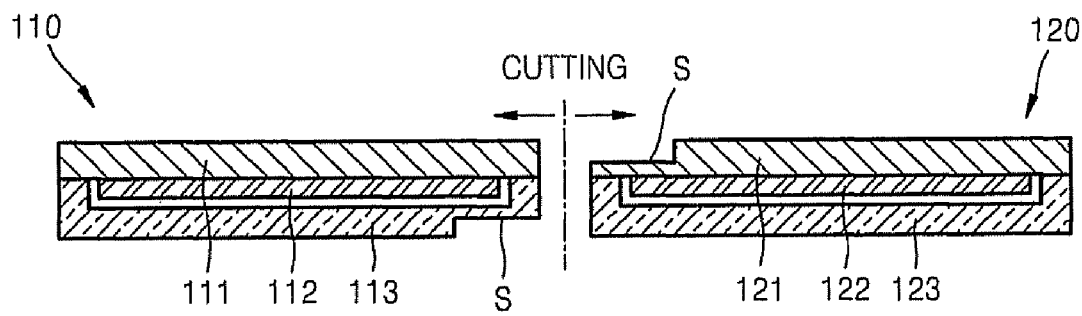
Figure 9D:
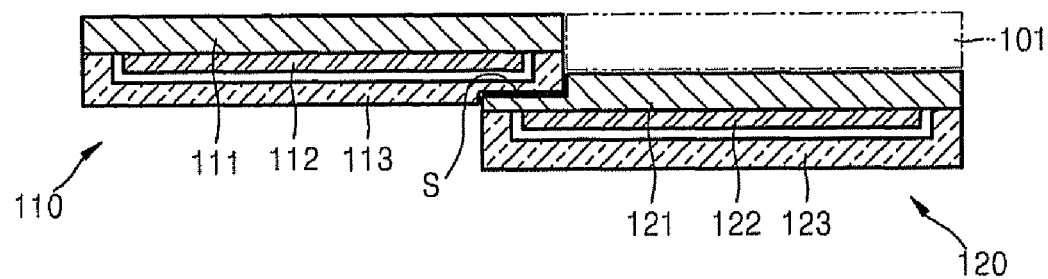

First, as depicted in FIG. 9A, the display panels 110 and 120 not yet separated are prepared. Then, as depicted in FIG. 9B, edges of the display panels 110 and 120 are etched to form stepped portions S. Afterwards, as depicted in FIG. 9C, the display panels 110 and 120 are separated by cutting. Next, as depicted in FIG. 9D, the display panels 110 and 120 are connected so that the stepped portions S engage with each other, and the optical film 101 is formed on the panel 120. Thus, the manufacture of the multi-display apparatus illustrated in FIG. 7 is completed.

Figure 10:
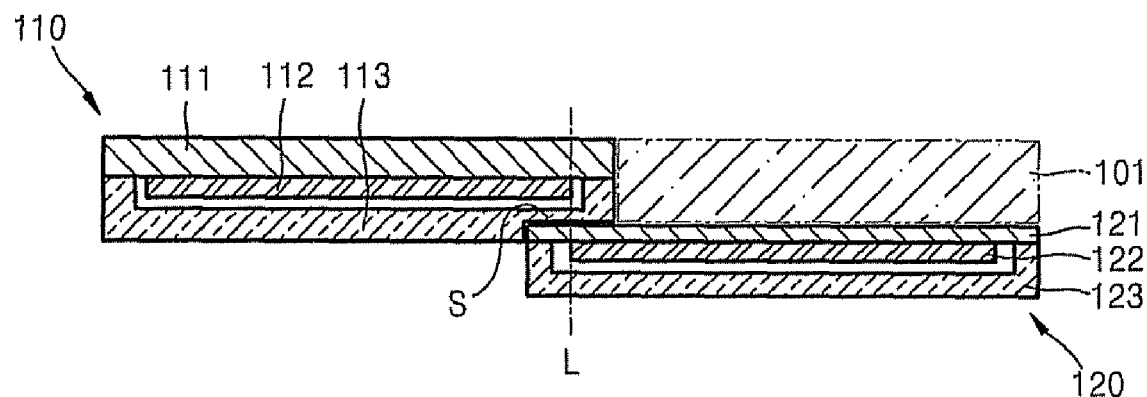
FIG. 10 illustrates a multi-display apparatus having a panel connection structure according to another exemplary embodiment of the present invention.

FIG. 10 illustrates a multi-display apparatus having a panel connection structure according to another embodiment of the present invention. In the present embodiment, an edge of a rear surface (i.e., an edge of the cover 113) of the display panel 110, which is located on a front side of the multi-display apparatus in relation to the display panel 120, is etched to obtain a stepped portion S, and the panel 120 is slimmed by etching the entire upper surface of the substrate 121. Then, an edge of the front surface of the slimmed display panel 120 is engaged with the stepped portion S of the display panel 110, so that the two display panels 110 and 120 are incorporated into a single screen.

The multi-display apparatus illustrated in FIG. 10 may also be manufactured according to either a method of performing etching after cutting the two display panels 110 and 120 or a method of cutting the two display panels 110 and 120 after performing etching. The manufacture of the multi-display apparatus of FIG. 10 according to the method of performing etching after cutting the two display panels 110 and 120 will now be described with reference to FIGS. 11A through 11D.

Figure 11A:
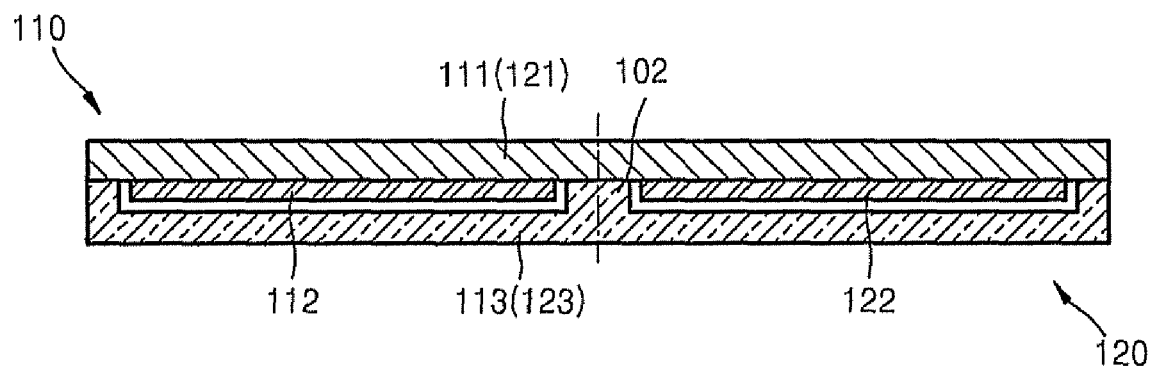
FIGS. 11A through 11D are cross-sectional views illustrating a method of manufacturing the multi-display apparatus of FIG. 10, according to an exemplary embodiment of the present invention.
Figure 11B:
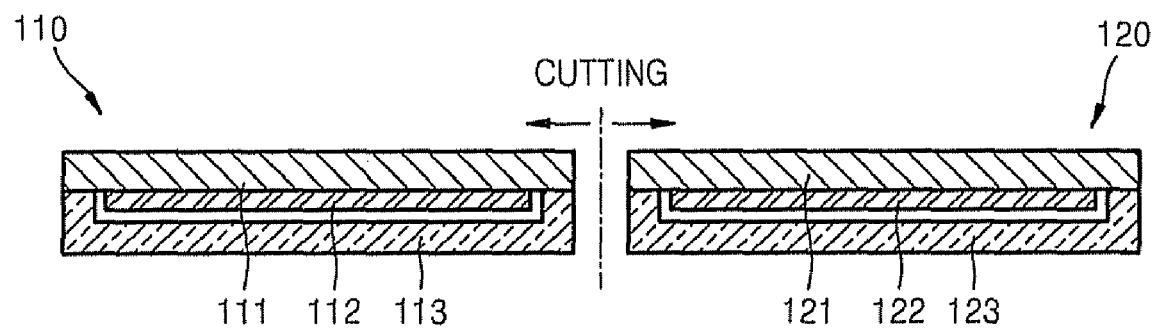
Figure 11C:
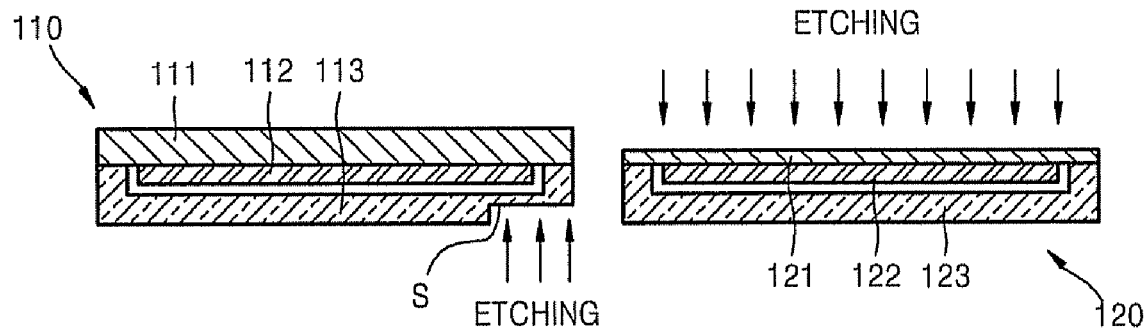
Figure 11D:
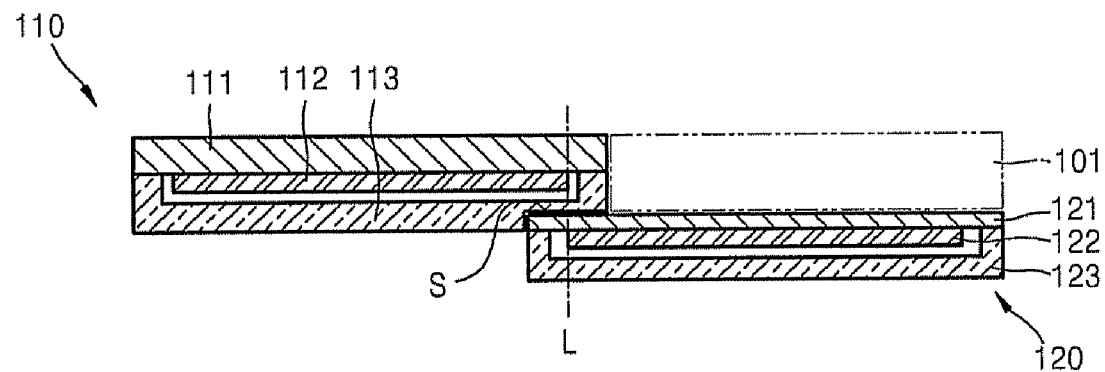

As depicted in FIG. 11A, first, the display panels 110 and 120, in which the two display devices 112 and 122 are disposed side by side on the substrates 111 and 121 and are respectively covered by the covers 113 and 123 having a separation wall 102 therebetween, are prepared. Referring to FIG. 11B, the two display panels 110 and 120 are separated by cutting the substrates 111 and 121 and the covers 113 and 123 along the center line of the separation wall 102. In this state, as depicted in FIG. 11C, the stepped portion S is formed by etching the cover 113 of the display panel 110, which is to be located on a front side of the multi-display apparatus, in a thickness direction of the display panel 110, and the display panel 120, which is to be located on a rear side of the multi-display apparatus, is slimmed by etching the entire upper surface of the substrate 121. Next, as depicted in FIG. 11D, the two display panels 110 and 120 are disposed so that an edge of the front surface of the display panel 120 is located in the stepped portion S of the display panel 110 and that boundaries of the display devices 112 and 122 of the display panels 110 and 120 are aligned on a single line L. As such, the two display panels 110 and 120 overlap in a thickness direction thereof, thereby reducing the thickness of the multi-display apparatus as compared to the prior art. In the present embodiment, if a folding type apparatus is produced, when the display panels 110 and 120 are unfolded, the display panels 110 and 120 can be coupled using a hinge to allow the display panels to be unfolded as depicted in FIG. 11D. Therefore, the image disconnection at a seam between the display panels 110 and 120 can be improved and the problem of increasing the thickness of the multi-display apparatus can also be solved. In addition, an optical film 101 is formed on the display panel 120 having a relatively lower surface level than the display panel 110 so that an upper surface of the display panel 120 is horizontally aligned with an upper surface of the display panel 110.

Figure 12A:
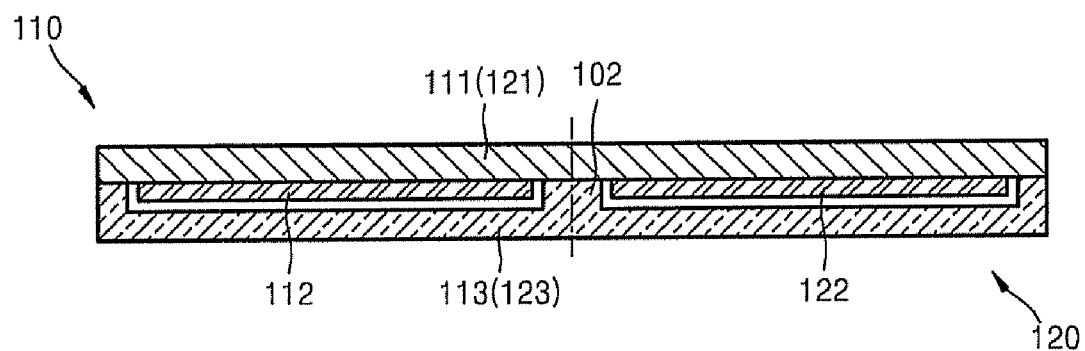
FIGS. 12A through 12D are cross-sectional views illustrating a method of manufacturing a panel connection structure of the multi-display apparatus of FIG. 10, according to another exemplary embodiment of the present invention.
Figure 12B:
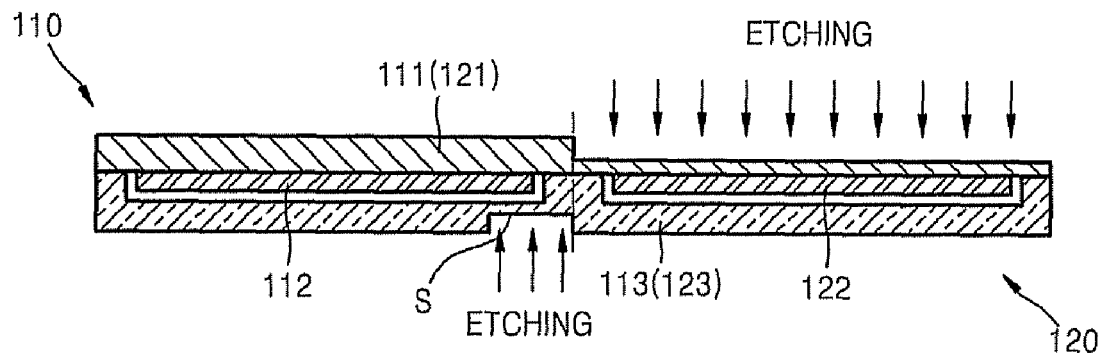
Figure 12C:
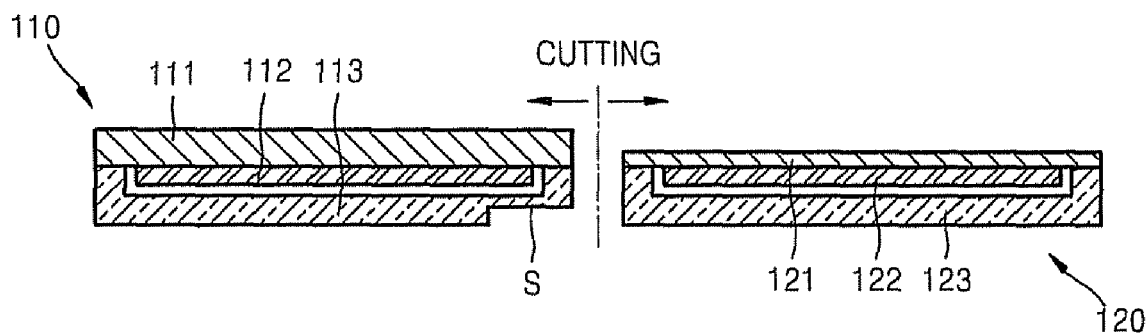
Figure 12D:
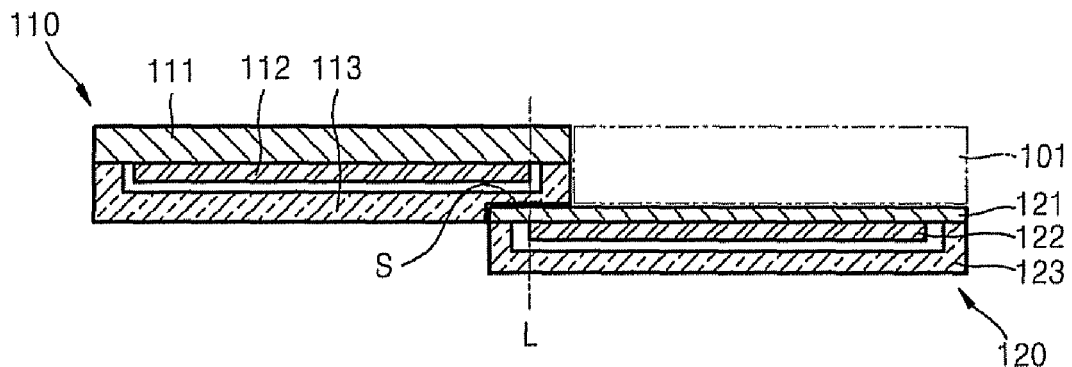

The manufacture of the multi-display apparatus illustrated in FIG. 10 according to the method of separating the two display panels 110 and 120 after performing etching will now be described with reference to FIGS. 12A through 12D. The preparation of the display panels 110 and 120 not yet separated as depicted in FIG. 12A is the same as that in the embodiment illustrated in FIG. 11A. Then, instead of separating the two display panels 110 and 120, as depicted in FIG. 12B, the cover 113 of the display panel 110 is etched in a thickness direction thereof so as to form a stepped portion S, and the entire upper surface of the substrate 121 of the display panel 120 is etched. Afterwards, as depicted in FIG. 12C, the two display panels 110 and 120 are separated by cutting. Next, as depicted in FIG. 12D, the two display panels 110 and 120 are connected together so that an edge of the front surface of the display panel 120 is located in the stepped portion S of the display panel 110, and the optical film 101 is installed on the display panel 120, thereby completing the structure of the multi-display apparatus illustrated in FIG. 10.

Figure 13:
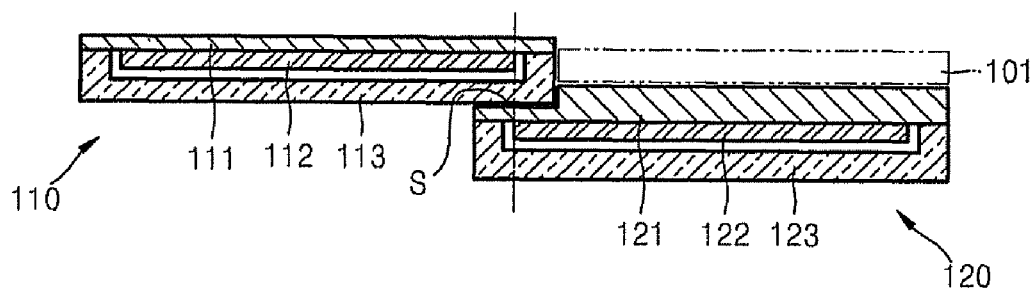
FIG. 13 illustrates a multi-display apparatus having a panel connection structure according to another exemplary embodiment of the present invention.

FIG. 13 illustrates a multi-display apparatus having a panel connection structure according to another embodiment of the present invention. In the present embodiment, an edge of a front surface (i.e., an edge of the substrate 121) of the display panel 120, which is located on a rear side of the multi-display apparatus in relation to the display panel 110, is etched to obtain a stepped portion S, and the panel 110 is slimmed by etching the entire upper surface of the substrate 111 corresponding to a front surface of the display panel 110. Then, an edge of the rear surface of the slimmed display panel 110 is engaged with the stepped portion S of the display panel 120, so that the two display panels 110 and 120 are incorporated into a single screen.

The multi-display apparatus illustrated in FIG. 13 may also be manufactured according to either a method of performing etching after cutting the two display panels 110 and 120 or a method of cutting the two display panels 110 and 120 after performing etching. The manufacture of the multi-display apparatus of FIG. 13 according to the method of performing etching after cutting the two display panels 110 and 120 will now be described with reference to FIGS. 14A through 14D.

Figure 14A:
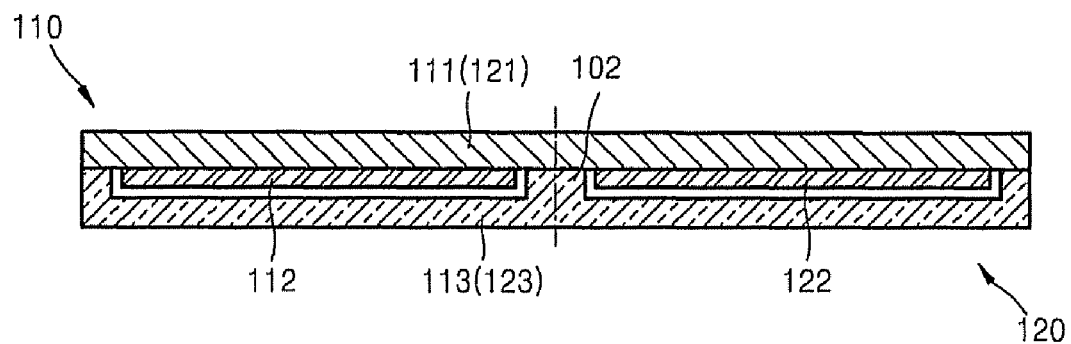
FIGS. 14A through 14D are cross-sectional views illustrating a method of manufacturing the multi-display apparatus of FIG. 13, according to an exemplary embodiment of the present invention.
Figure 14B:
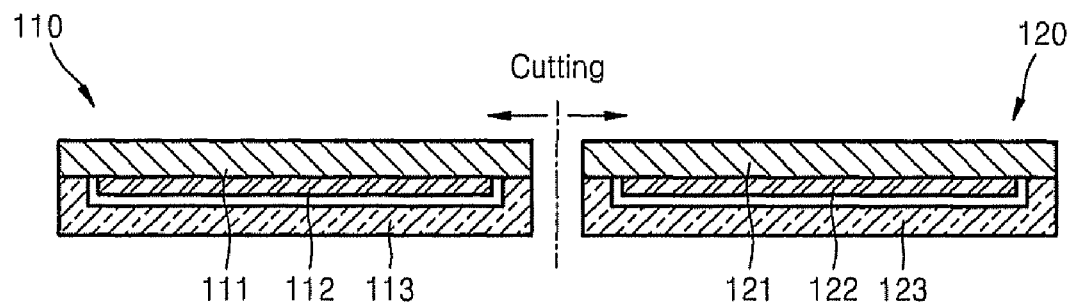
Figure 14C:
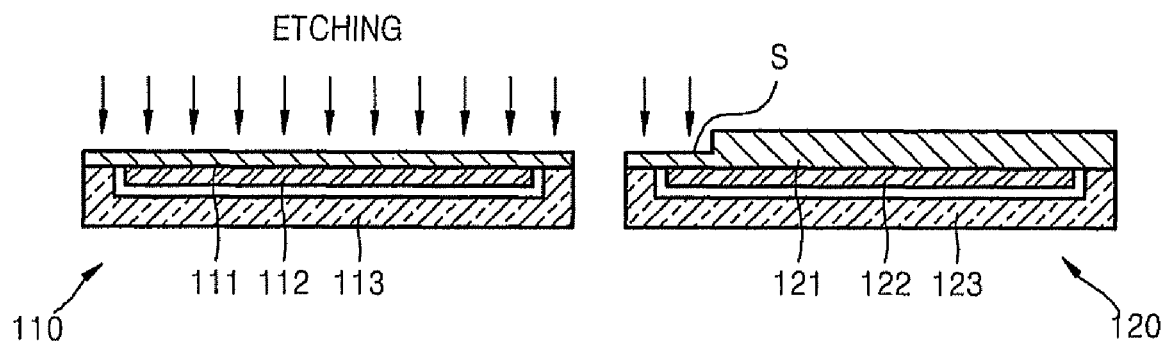
Figure 14D:
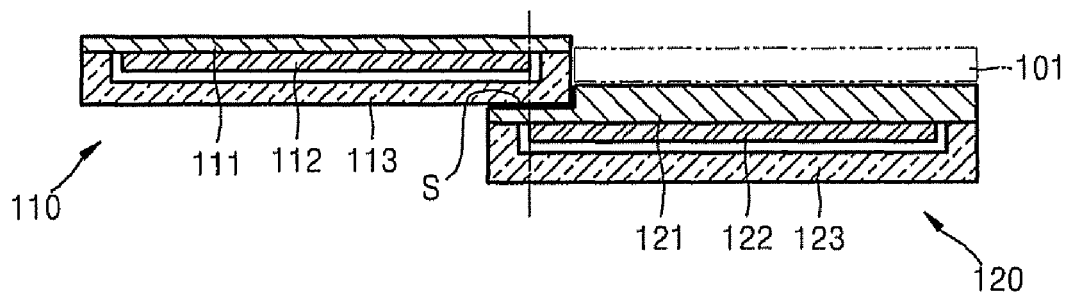

As depicted in FIG. 14A, first, the display panels 110 and 120, in which the two display devices 112 and 122 are disposed side by side on the substrates 111 and 121 and are respectively covered by the covers 113 and 123 having a separation wall 102 therebetween, are prepared. Referring to FIG. 14B, the two display panels 110 and 120 are separated by cutting the substrates 111 and 121 and the covers 113 and 123 along the center line of the separation wall 102. In this state, as depicted in FIG. 14C, the stepped portion S is formed by etching an edge of the substrate 121 of the display panel 120, which is to be located on a rear side of the multi-display apparatus, in a thickness direction of the display panel 120, and the display panel 110, which is to be located on a front side of the multi-display apparatus, is slimmed by etching the entire upper surface of the substrate 111. Next, as depicted in FIG. 14D, the two display panels 110 and 120 are disposed so that an edge of the rear surface of the display panel 110 is located in the stepped portion S of the display panel 120. As such, the two display panels 110 and 120 overlap in a thickness direction thereof, thereby reducing the thickness of the multi-display apparatus as compared to the prior art. Therefore, the image disconnection at a seam between the display panels 110 and 120 can be improved and the problem of increasing the thickness of the multi-display apparatus can also be solved. In addition, an optical film 101 is formed on the display panel 120 having a relatively lower surface level than the display panel 110 so that an upper surface of the display panel 120 is horizontally aligned with an upper surface of the display panel 110.

Figure 15A:
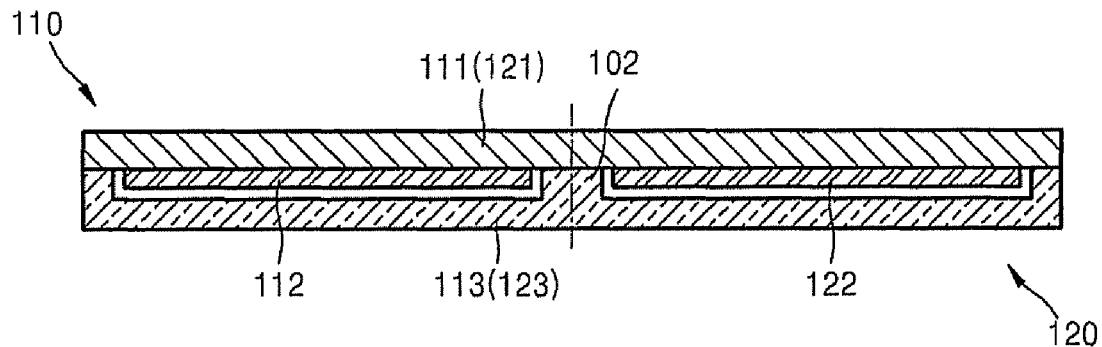
FIGS. 15A through 15D are cross-sectional views illustrating a method of manufacturing a panel connection structure of the multi-display apparatus of FIG. 13, according to another exemplary embodiment of the present invention.
Figure 15B:
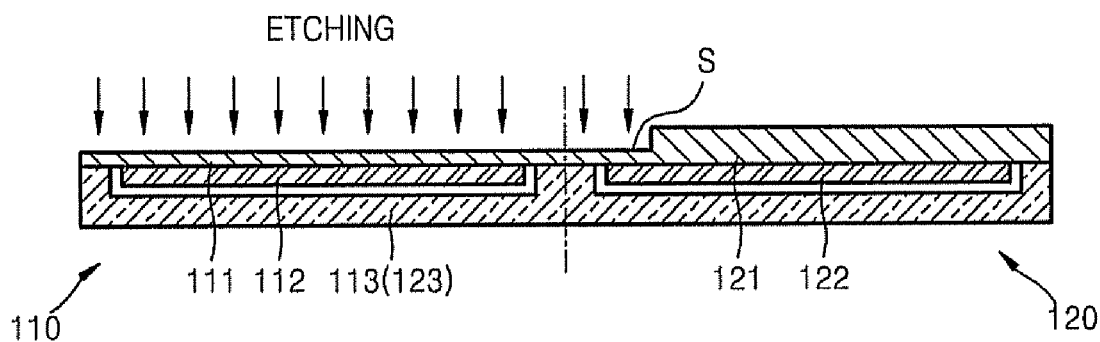
Figure 15C:
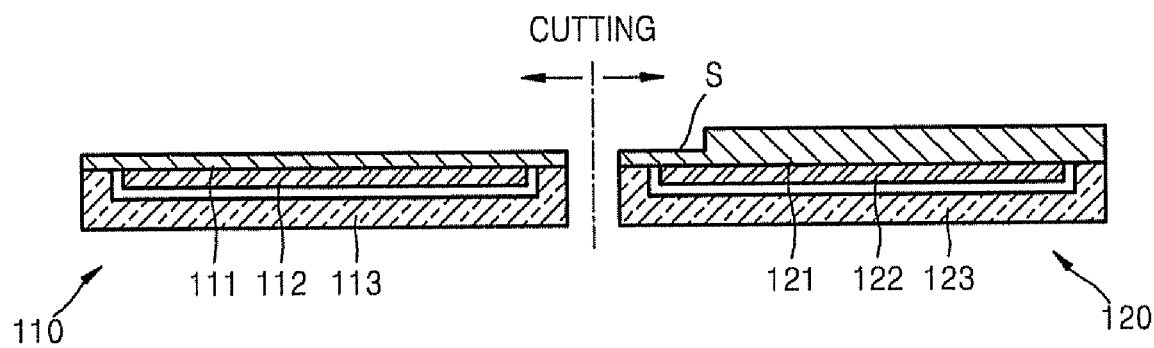
Figure 15D:
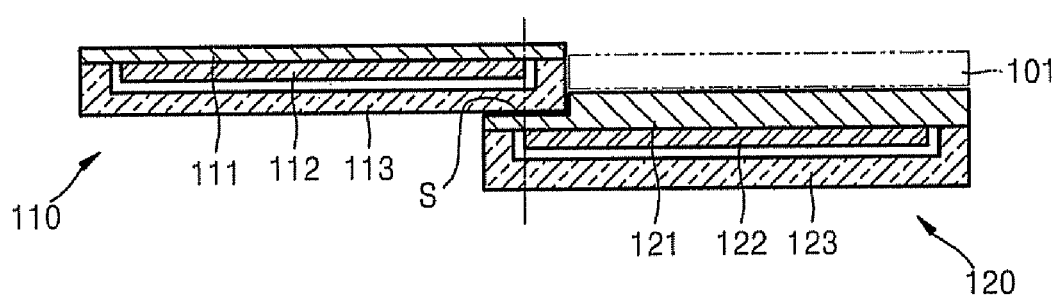

The manufacture of the multi-display apparatus illustrated in FIG. 13 according to the method of separating the two display panels 110 and 120 after performing etching will now be described with reference to FIGS. 15A through 15D. First, as depicted in FIG. 15A, the display panels 110 and 120 not yet separated are prepared. Then, as depicted in FIG. 15B, prior to separating the two display panels 110 and 120, an edge of the substrate 121 of the display panel 120, which is located at a rear side of the multi-display apparatus, is etched in a thickness direction thereof SO as to form a stepped portion S, and the display panel 110, which is located at a front side of the multi-display apparatus, is slimmed by etching the entire upper surface of the substrate 111 of the display panel 110. Afterwards, as depicted in FIG. 15C, the two display panels 110 and 120 are separated by cutting. Next, as depicted in FIG. 15D, the two display panels 110 and 120 are connected together so that an edge of the rear surface of the display panel 110 is located in the stepped portion S of the display panel 120, and the optical film 101 is installed on the display panel 120, thereby completing the structure of the multi-display apparatus illustrated in FIG. 13.

Figure 16:
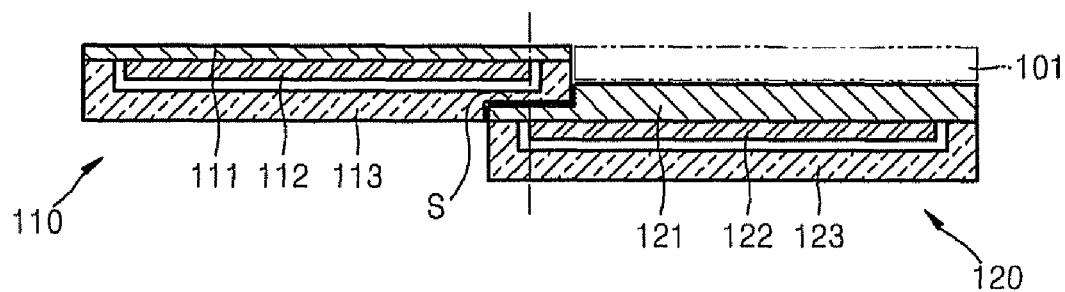
FIG. 16 illustrates a multi-display apparatus having a panel connection structure according to another exemplary embodiment of the present invention.

FIG. 16 illustrates a multi-display apparatus having a panel connection structure according to another embodiment of the present invention. In the present embodiment, an edge of the substrate 121 corresponding to a front surface of the display panel 120, which is located on a rear side of the multi-display apparatus, and an edge of the cover 113 corresponding to a rear surface of the display panel 110, which is located on a front side thereof, are etched to obtain stepped portions S, and the panel 110 is slimmed by etching the entire upper surface of the substrate 111 thereof. Then, the stepped portions S of the display panels 110 and 120 engage with each other, so that the two display panels 110 and 120 are incorporated into a single screen.

The multi-display apparatus illustrated in FIG. 16 may also be manufactured according to either a method of performing etching after cutting the two display panels 110 and 120 or a method of cutting the two display panels 110 and 120 after performing etching. The manufacture of the multi-display apparatus of FIG. 16 according to the method of performing etching after cutting the two display panels 110 and 120 will now be described with reference to FIGS. 17A through 17D.

Figure 17A:
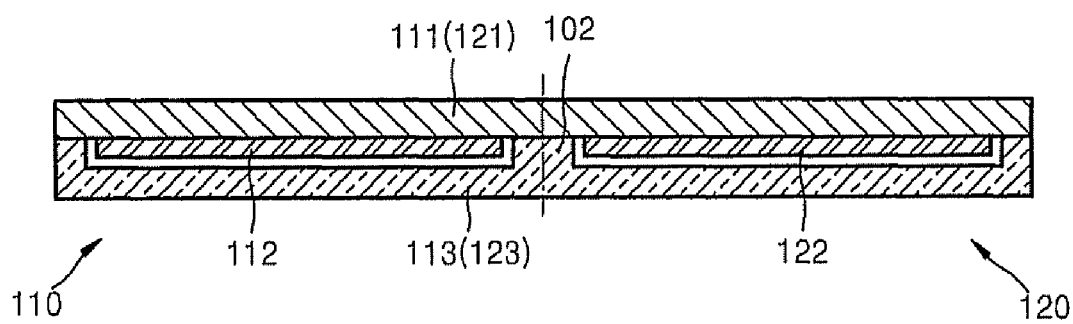
FIGS. 17A through 17D are cross-sectional views illustrating a method of manufacturing the multi-display apparatus of FIG. 16, according to an exemplary embodiment of the present invention.
Figure 17B:
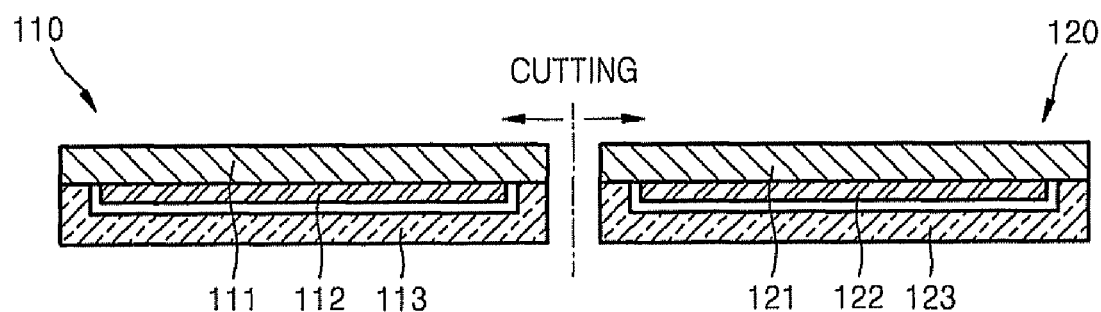
Figure 17C:
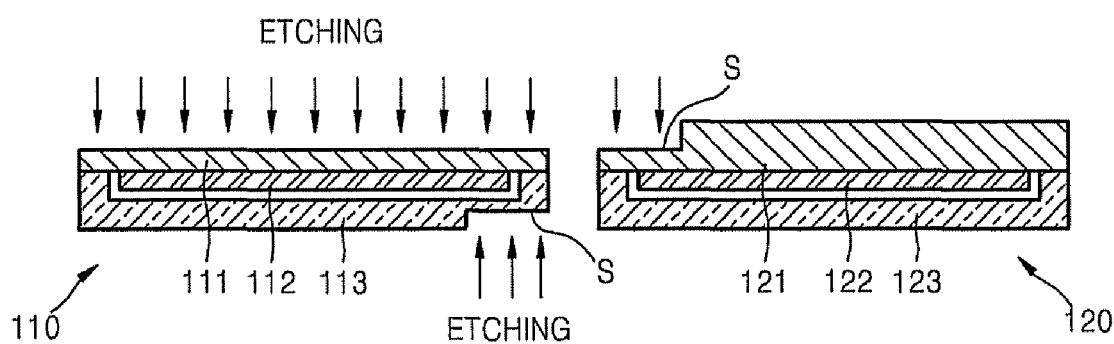
Figure 17D:
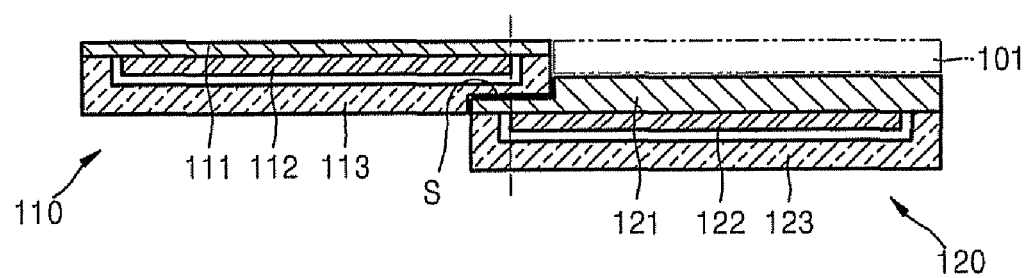

More specifically, the display panels 110 and 120 are prepared as depicted in FIG. 17A and are separated by cutting as depicted in FIG. 17B. As depicted in FIG. 17C, the entire upper surface of the substrate 111 of the display panel 110, which is located on a front side thereof, and a portion of the cover 113 thereof are etched, and a portion of the substrate 121 of the display panel 120, which is located on a rear side of the multi-display apparatus, is etched. Next, as depicted in FIG. 17D, the two display panels 110 and 120 are disposed so that stepped portions S formed by the etching depicted in FIG. 17C overlap with each other. The basic processes are the same as previously described embodiments; however, in the present embodiment, since the substrate 111 of the display panel 110 is etched, the height difference between the display panels 110 and 120 is relatively small. Accordingly, the height difference between the display panels 110 and 120 does not pose any issues with respect to image quality. Of course, it will be understood that the optical film 101 may be formed on the substrate 121 in a manner similar to that described above.

Figure 18A:
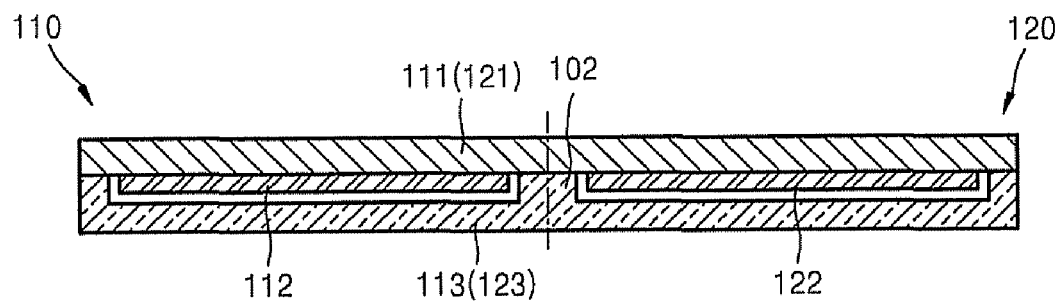
FIGS. 18A through 18D are cross-sectional views illustrating a method of manufacturing a panel connection structure of the multi-display apparatus of FIG. 16, according to another exemplary embodiment of the present invention.
Figure 18B:
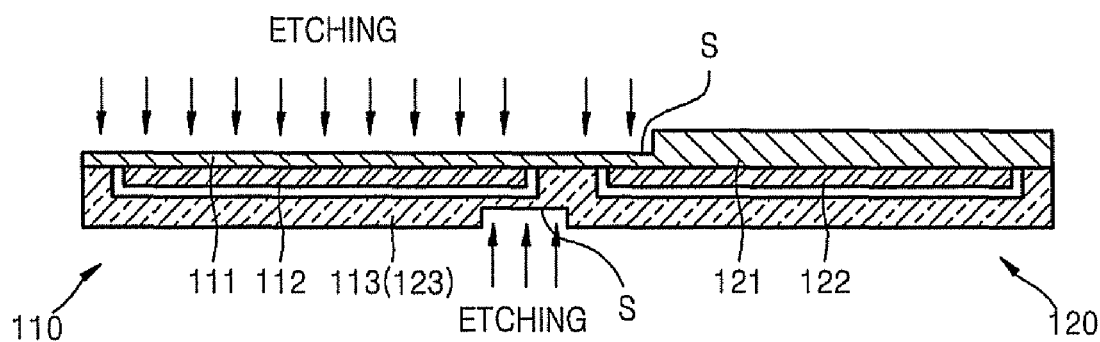
Figure 18C:
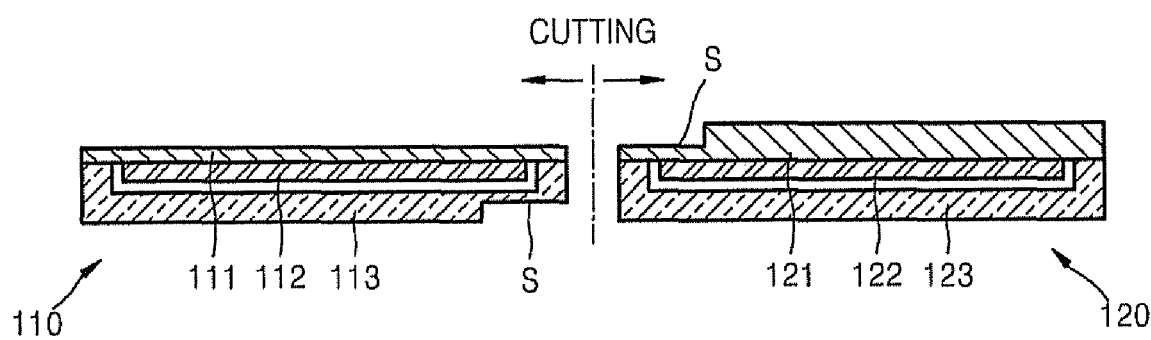
Figure 18D:
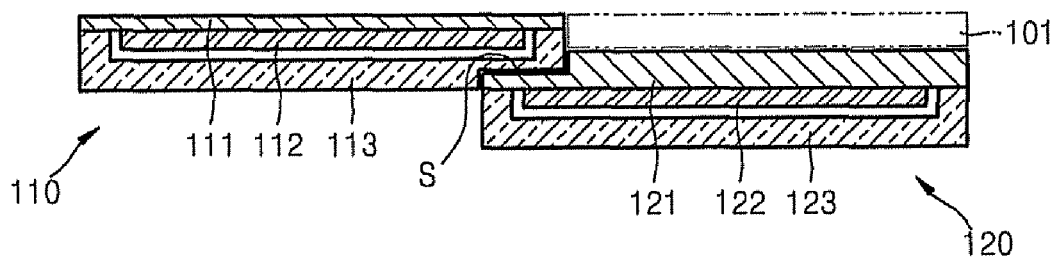

The manufacture of the multi-display apparatus illustrated in FIG. 16 according to the method of separating the two display panels 110 and 120 after performing etching will now be described with reference to FIGS. 18A through 18D. More specifically, as depicted in FIG. 18A, the display panels 110 and 120 not yet separated are prepared. Then, as depicted in FIG. 18B, the display panel 110, which is located at a front side of the multi-display apparatus, is slimmed by etching the entire upper surface of the substrate 111 of the display panel 110, a portion of the cover 113 of the display panel 110 is etched to form a stepped portion S, and a portion of the substrate 121 of the display panel 120, which is located at a rear side of the multi-display apparatus, is etched to form a stepped portion S. Afterwards, as depicted in FIG. 18C, the two display panels 110 and 120 are separated by cutting. Next, as depicted in FIG. 18D, the two display panels 110 and 120 are connected together so that the stepped portions S thereof engage with each other, thereby completing the structure of the multi-display apparatus illustrated in FIG. 16.

Accordingly, when a multi-display apparatus is manufactured by connecting the two display panels 110 and 120 using the above described methods, the image disconnection at a seam between the display panels 110 and 120 can be improved by connecting the display devices 112 and 122, and the thickness of the multi-display apparatus can be reduced as compared to the prior art. Therefore, it is advantageous for product slimness.

Figure 19A:
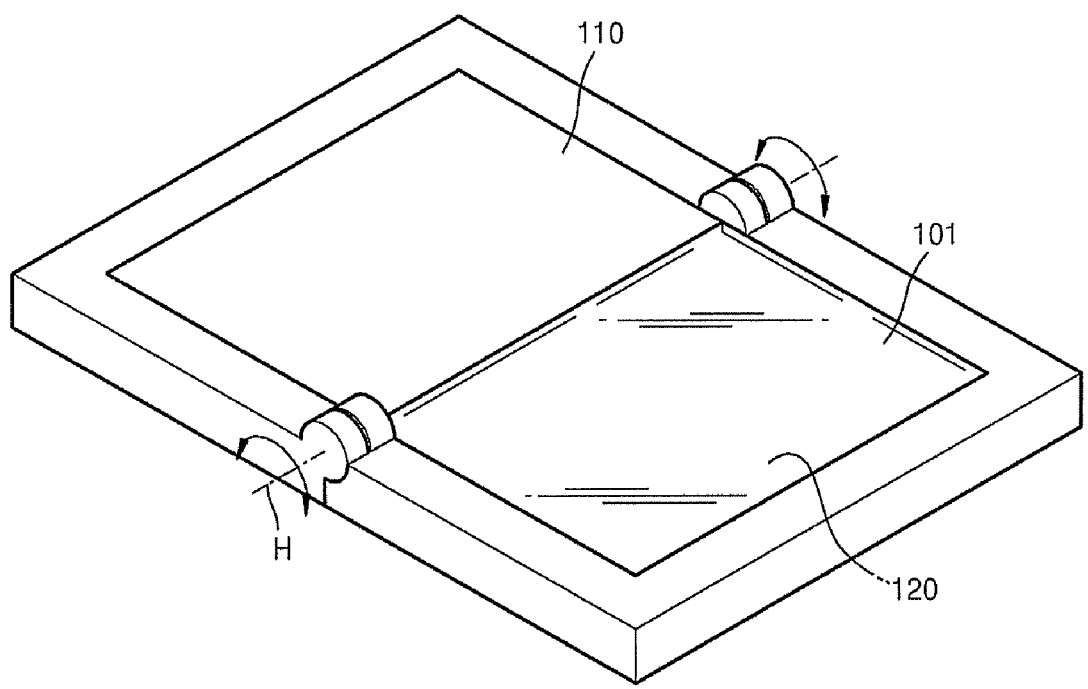
FIGS. 19A and 19B illustrate the exterior of a folder type multi-display apparatus according to the present invention.
Figure 19B:
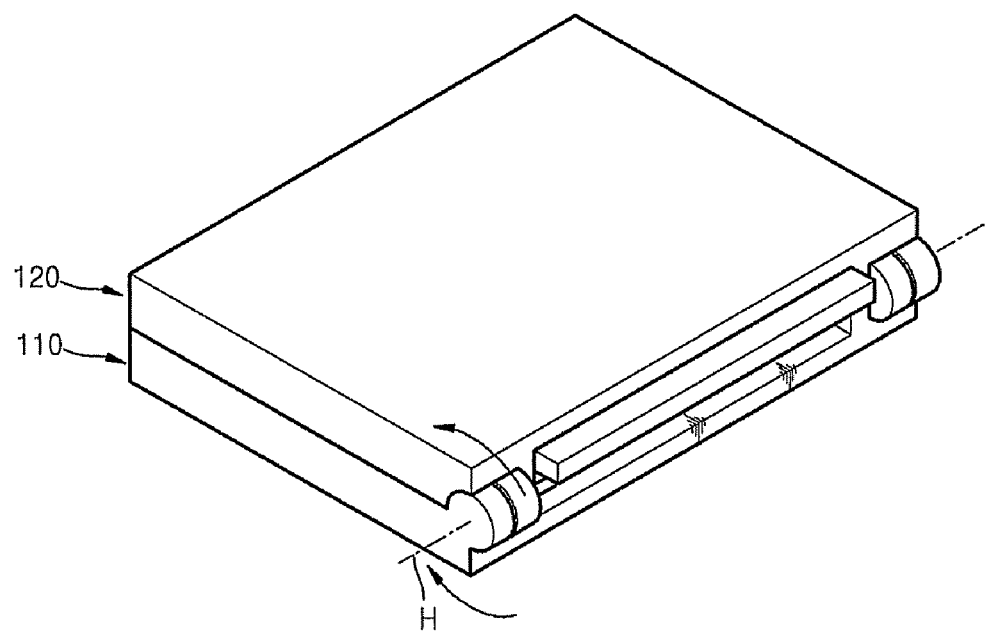

FIGS. 19A and 19B illustrate the exterior of a folder type multi-display apparatus employing the above-described panel connection structures. As depicted in FIGS. 19A and 19B, the two display panels 110 and 120 form a multi-image by being connected in a folder type of connection in which the display panels 110 and 120 can be folded and unfolded with respect to a hinge axis H. In other words, when the display panels 110 and 120 folded as shown in FIG. 19B are unfolded as shown in FIG. 19A, the display panels 110 and 120 are configured with a step difference as described in the above-described embodiments. As described above, in this structure of the multi-display apparatus, boundaries of the display devices 112 and 122 are overlapped when viewed from above the seam between the display panels 110 and 120, so that the image appears to be connected.

Examples of the display panels 110 and 120 may include various flat panel display devices such as liquid crystal displays (LCDs), field emission displays (FEDs), plasma display panels (PDPs), and organic light-emitting diodes (OLEDs).

A multi-display apparatus and a method of manufacturing the multi-display apparatus according to the present invention as described above improve image disconnection at a seam between display panels thereof and reduce the thickness of the multi-display apparatus, thereby resulting in a slim and high quality multi-display apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-display apparatus, comprising:
a plurality of display panels displaying images; and
a stepped portion in a rearmost or frontmost surface of at least one of a pair of adjacent display panels of the plurality of display panels in a thickness direction, wherein
each of the pair of adjacent display panels is engaged with each other in the stepped portion,
the pair of adjacent display panels respectively includes a first display device and a second display device, and
a pixel boundary of the first display device is aligned with a pixel boundary of the second display device in the thickness direction.

2. The multi-display apparatus of claim 1, wherein the stepped portion is formed in an edge of the rearmost surface of one of the pair of adjacent display panels, and an edge of a front surface of the other display panel is disposed in the stepped portion.

3. The multi-display apparatus of claim 1, wherein the stepped portion is formed in an edge of the frontmost surface of one of the pair of adjacent display panels, and an edge of a rear surface of the other display panel is disposed in the stepped portion.

4. The multi-display apparatus of claim 1, wherein the stepped portion is formed in each of the pair of adjacent display panels, and the stepped portions of the pair of adjacent display panels engage with each other.

5. The multi-display apparatus of claim 1, wherein:
the stepped portion is formed in an edge of the rearmost surface of one of the pair of adjacent display panels so that an edge of a front surface of the other display panel is disposed in the stepped portion; and
the other display panel is thinner than the one display panel.

6. The multi-display apparatus of claim 1, wherein:
the stepped portion is formed in an edge of the frontmost surface of one of the pair of adjacent display panels so that an edge of a rear surface of the other display panel is disposed in the stepped portion; and
the other display panel is thinner than the one display panel.

7. The multi-display apparatus of claim 1, wherein:
the stepped portion is formed in an edge of the rearmost surface of one of the pair of adjacent display panels and an edge of the frontmost surface of the other panel so that the stepped portions engage with each other; and
the one display panel is thinner than the other display panel.

8. The multi-display apparatus of claim 1, wherein the plurality of display panels are connected to one another so as to have a folding type structure.

9. The multi-display apparatus of claim 1, wherein:
one of the pair of adjacent display panels comprises a first substrate, the first display device on the first substrate, and a first cover which covers the first display device;
the other of the pair of adjacent display panels comprises a second substrate, the second display device on the second substrate, and a second cover which covers the second display device; and
the substrate includes the frontmost surface of each display panel, and the cover includes the rearmost surface of each display panel, respectively.

10. The multi-display apparatus of claim 1, further comprising an optical film formed on one of the pair of adjacent display panels such that upper surfaces of the pair of adjacent display panels are horizontally aligned, wherein the display panel on which the optical film is formed is a display panel located on a rear side of the multi-display apparatus.

11. The multi-display apparatus of claim 1, wherein the stepped portion is formed by etching.

12. A method of manufacturing a multi-display apparatus comprising:
preparing a pair of adjacent display panels respectively comprising a first display device and a second display device;
forming a stepped portion in a rearmost or a frontmost surface of at least one of the pair of adjacent display panels in a thickness direction; and
aligning a pixel boundary of the first display device with a pixel boundary of the second display device in the thickness direction so as to form a screen, such that each of the pair of adjacent display panels is engaged with each other in the stepped portion.

13. The method of claim 12, wherein the stepped portion is formed in an edge of the rearmost surface of one of the pair of adjacent display panels, and an edge of a front surface of the other display panel is disposed in the stepped portion.

14. The method of claim 12, wherein the stepped portion is formed in an edge of the frontmost surface of one of the pair of adjacent display panels, and an edge of a rear surface of the other display panel is disposed in the stepped portion.

15. The method of claim 12, wherein:
the stepped portion is formed in an edge of the rearmost surface of one of the pair of adjacent display panels and an edge of the frontmost surface of the other panel; and
the stepped portions engage with each other so that the pair of display panels is connected to each other.

16. The method of claim 12, wherein the pair of adjacent display panels are connected to each other so as to have a folding type structure.

17. The method of claim 12, further comprising reducing a thickness of the multi-display apparatus by etching the entire upper surface of at least one of the pair of adjacent display panels.

18. The method of claim 12, wherein:
the preparation of the pair of adjacent display panels comprises, after stacking the first and the second display devices in parallel on a substrate and covering the first and the second display devices using a cover having a separation wall between the first and second display devices, separating the pair of display panels by cutting along the separation wall; and
the forming of the stepped portion is performed after the separating of the pair of adjacent display panels.

19. The method of claim 12, wherein:
the preparation of the pair of adjacent display panels comprises stacking the first and the second display devices in parallel on a substrate and covering the first and the second display devices using a cover having a separation wall between the first and the second display devices;
in the forming of the stepped portion, the stepped portion is formed by etching the display panels not yet separated; and
in the engaging of the display panels, the pair of display panels is separated by cutting along the separation wall, and the display panels are coupled to each other in the stepped portion.

20. The method of claim 12, further comprising forming an optical film on a surface of one of the display panels such that upper surfaces of the pair of display panels are horizontally aligned, wherein the display panel on which the optical film is formed is a display panel located on a rear side of the multi-display apparatus.

21. The multi-display apparatus of claim 1, wherein the plurality of display panels includes:
a first display panel displaying images, and including a first substrate, the first display device on the first substrate, and a first cover which covers the first display device; and
a second display panel adjacent to the first display panel and displaying images, and including a second substrate, the second display device on the second substrate, and a second cover which covers the second display device;
the stepped portion is in at least one of the first display panel and the second display panel;
a portion of the first cover of the first display panel is between the first substrate and the second substrate when each of the pair of adjacent display panels is engaged with each other in the stepped portion; and
the substrate is the frontmost surface of each display panel, and the cover is the rearmost surface of each display panel.

22. The method of claim 12, wherein
each of the pair of adjacent display panels includes a substrate, the display device on the substrate and a cover covering the display device; and
a portion of the cover of one the pair of adjacent display panels, is between the substrates of the pair of display panels when each of the pair of adjacent display panels is engaged with each other in the stepped portion.

* * * * *